United States Patent
Wong (12)

(10) Patent No.: US 6,376,265 B1
(45) Date of Patent: Apr. 23, 2002

(54) NON-CONTACT AUTOMATIC HEIGHT SENSING USING AIR PRESSURE FOR DIE BONDING

(75) Inventor: Pak C. Wong, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/543,347

(22) Filed: Apr. 5, 2000

(51) Int. Cl.[7] .......................... G01R 31/26; H01L 21/66
(52) U.S. Cl. ........................................ 438/15; 438/106
(58) Field of Search ...................... 438/15, 106, 108, 438/109, 118, 124, 126, 127, 25, 26, 50, 55, 64

(56) References Cited

U.S. PATENT DOCUMENTS

| | | | | |
|---|---|---|---|---|
| 5,766,984 A | * | 7/1998 | Ramm et al. | 438/109 |
| 5,784,780 A | * | 7/1998 | Loo | 29/840 |
| 6,232,152 B1 | * | 5/2001 | Distefano et al. | 438/124 |

FOREIGN PATENT DOCUMENTS

JP    08137154    * 12/1997

* cited by examiner

*Primary Examiner*—David Nelms
*Assistant Examiner*—Phuc T. Dang

(57) ABSTRACT

A method and apparatus is provided for bonding a semiconductor die to a substrate, such as bonding an upper die to the lower semiconductor die of a stacked die assembly. Embodiments include a die bonder with an air pressure sensor for directing a jet of air to the top surface of the lower die. The air pressure sensor generates a signal indicative of the height of the top surface of the lower die based on the back pressure of the jet of air, and sends the signal to a controller for accurately setting the descending height of the upper die onto the lower die to produce the required gap between the two dies for die bonding. Since the sir pressure sensor only contacts the substrate with a relatively small jet of air, the top surface of the lower die is not damaged by the sensor. Because the air pressure sensor accurately measures the height of the lower die, the upper die is placed above the lower die with the proper gap, despite variations in the height of the lower die. As a result, damage to the dies during assembly is reduced, thereby increasing manufacturing yield and reducing production costs.

8 Claims, 3 Drawing Sheets

NON-CONTACT AUTOMATIC HEIGHT SENSING USING AIR PRESSURE FOR DIE BONDING

FILED OF THE INVENTION

The present invention relates to a method and apparatus for die bonding in semiconductor package structures. The present invention has particular applicability in manufacturing stacked die and flip-chip package assemblies.

BACKGOUND ART

One type of conventional semiconductor packaging structure is known as a "stacked die" package, wherein a first bare semiconductor ship, called a "die", is bonded, as with epoxy adhesive, to a substrate, such as a circuit board or lead frame, and a second die is bonded to the top surface of the first die using adhesive tape or epoxy. Wire bonds electrically connect both dies to the substrate.

The first and second dies are typically bonded using automated die bonding equipment that pick up a die and places it in a predetermined position slightly above the substrate or first die, respectively, thereby creating a gap between the die and the surface to which it is to bond. The adhesive fills this gap. To avoid damage to the dies from contact with each other or the substrate, it is necessary to ascertain the location of the top surface of the substrate (i.e., its height, or "z-dimension") before bonding the first die to the substrate. Likewise, it is necessary to ascertain the location of the top surface of the first die before bonding the second die.

Conventional techniques for setting the die bonder to place the dies in position for bonding include a trial-and-error method, wherein the height of the substrate or substrate/first die assembly is measured, as with a micrometer, and the die bonder adjusted accordingly. If the adjustment is determined to be incorrect after testing, the die bonder is re-adjusted as needed. A significant drawback of the trial-and-error technique when used with stacked die packages is that it cannot automatically compensate for variations in the height of the substrate/first die assembly. Thus, for example, when the top surface of the first die is higher than expected by the die bonder due to the limitations of the manufacturing or assembly process, the first die and/or second die could be damaged when the second die descends on the first die without adequate clearance.

This drawback of the trial-and-error method has been addressed in the prior art by the adoption of a feedback height adjustment mechanism, wherein a sensor makes physical contact with the top surface of the first die, then sends a signal to a die bonder controller indicative of the height of the first die. The controller then sets the descending height of the second die onto the first die responsive to the height signal to produce the required gap between the dies, thereby avoiding damage to either die.

Disadvantageously, conventional physical contact height sensors, typically comprising needles for touching the die, can damage the top surface of the die, thereby causing failure of the completed assembly. To overcome this drawback, it has been proposed to utilize a laser sensor for non-contact height measurement. However, lasers are problematic in that laser radiation can be reflected from the top surface of the die, due to the presence of reflective materials such as silicon and aluminum in the die, thereby reducing the accuracy of the height measurement. Furthermore, certain types of dies may be damaged by exposure to laser radiation.

These exists a need for a method and apparatus for measuring the height of package assemblies comprising semiconductor dies that is accurate and does not damage the dies.

SUMMARY OF THE INVENTION

An advantage of the present invention is a method and apparatus for accurately measuring the height of a top surface of a substrate or die prior to a die bonding operation that does not damage the die.

Additional advantages and other features of the present invention will be set forth in part in the description which follows and in part will become apparent to those having ordinary skill in the art upon examination of the following or may be learned from the practice of the invention. The advantages of the invention may be realized and obtained as particurlarly pointed out in the appended claims.

According to the present invention, the foregoing and other advantages are achieved in part by a method of manufacturing a semiconductor package assembly, which method comprises directing a jet of air to a top surface of a substrate; determining a vertical position of the top surface of the substrate based on the back pressure of the jet air; and positioning a semiconductor device a predetermined distance above the top surface of the substrate, based on the determination of the vertical position of the substrate top surface, for bonding the semiconductor device to the substrate.

Another aspect of the present invention is an appartus for acrrying out the above method.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Traditional methodologies for setting the descending height of a die bonder for stacked die packages do not measure the height of the top surface of every die prior to bonding another die on top of it, which results in damage to one or both of the dies when the height of the lower die varies. Other conventional techniques employ feedback mechanisms for setting the height comprising sensors that physically contact the lower die, thereby resulting in damage to the lower die, an increase in the cost of the finished device and reduced manufacturing yield. The present invention addresses and solves these problems stemming from conventional die bonding processes.

According to the present invention, a die bonder for bonding a semiconductor die to a substrate, such as bonding an upper die to the lower semiconductor die of a stacked die assembly, is provided with an air pressure sensor for directing a jet of air to the top surface of the lower die. The air pressure sensor generates a signal indicative of the height of the top surface of the lower die based on the back pressure of the jet of air, and sends the signal to a controller for accurately setting the descending height of the upper die onto the lower die to produce the required gap between the two dies for die bonding. Since the air pressure sensor only contacts the substrate with a realtively small jet of air, top surface of the lower die is not damaged by the sensor. Furthermore, since the air pressure sensor accurately measures the height of the lower die, the upper die is placed above the lower die with the proper gap, despite variations in the height of the lower die. As a result, damage to the dies during assembly is reduced, thereby increasing manufacturing yield and reducing production costs.

Figure 1:
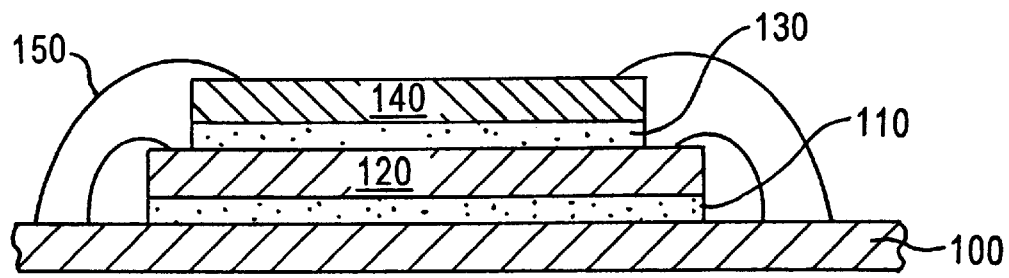
FIG. 1 illustrates a stacked die package assembled using the present invention.

An embodiment of the present invention will now be described with reference to FIGS. 1–3. FIG. 1 shows a typical completed stacked die assembly, comprising a substrate 100 such as a metal lead frame or a circuit board, a first die 120 attached to substrate 100 with an adhesive 110 such as epoxy, and a second die 140 attached to first die 120 with an adhesive 130 such as epoxy. First die 120 and second die 140 are typically electrically connected with substrate 100 via wires 150 such as gold wires.

Figure 2A:
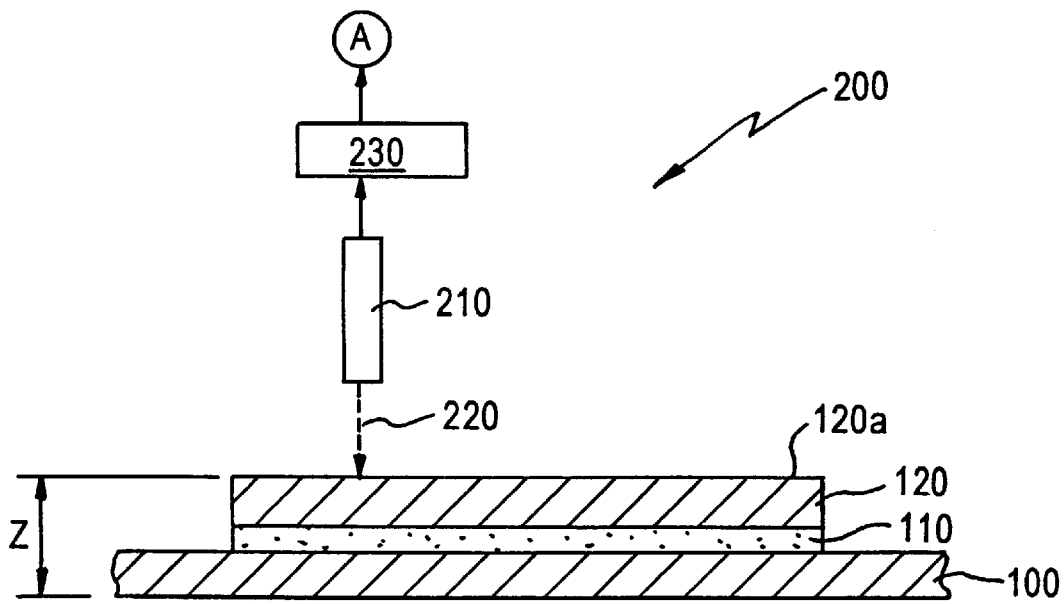
FIG. 2A and 2B schematically illustrate an apparatus according to an embodiment of the present invention.
Figure 2B:
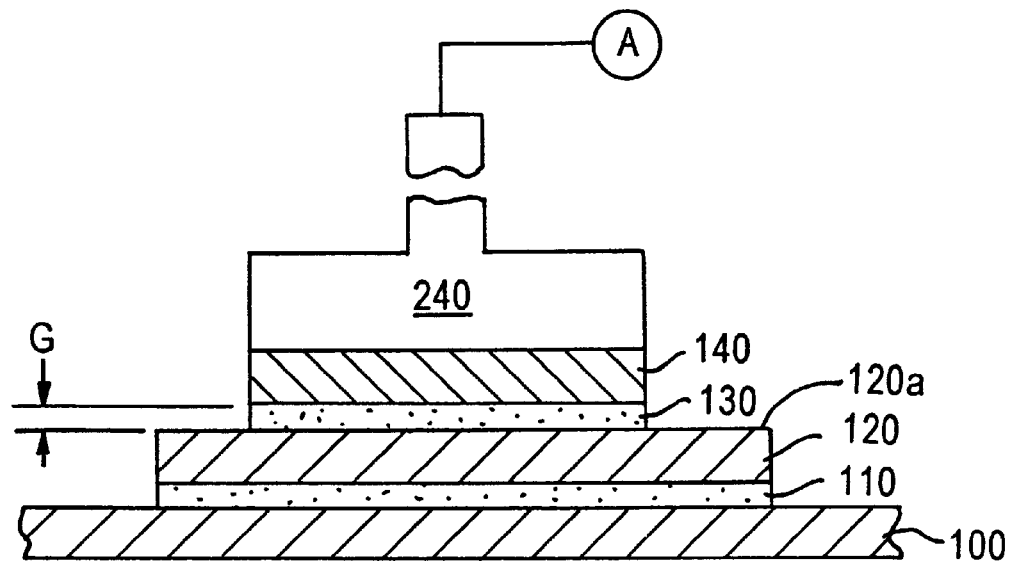
Figure 3:
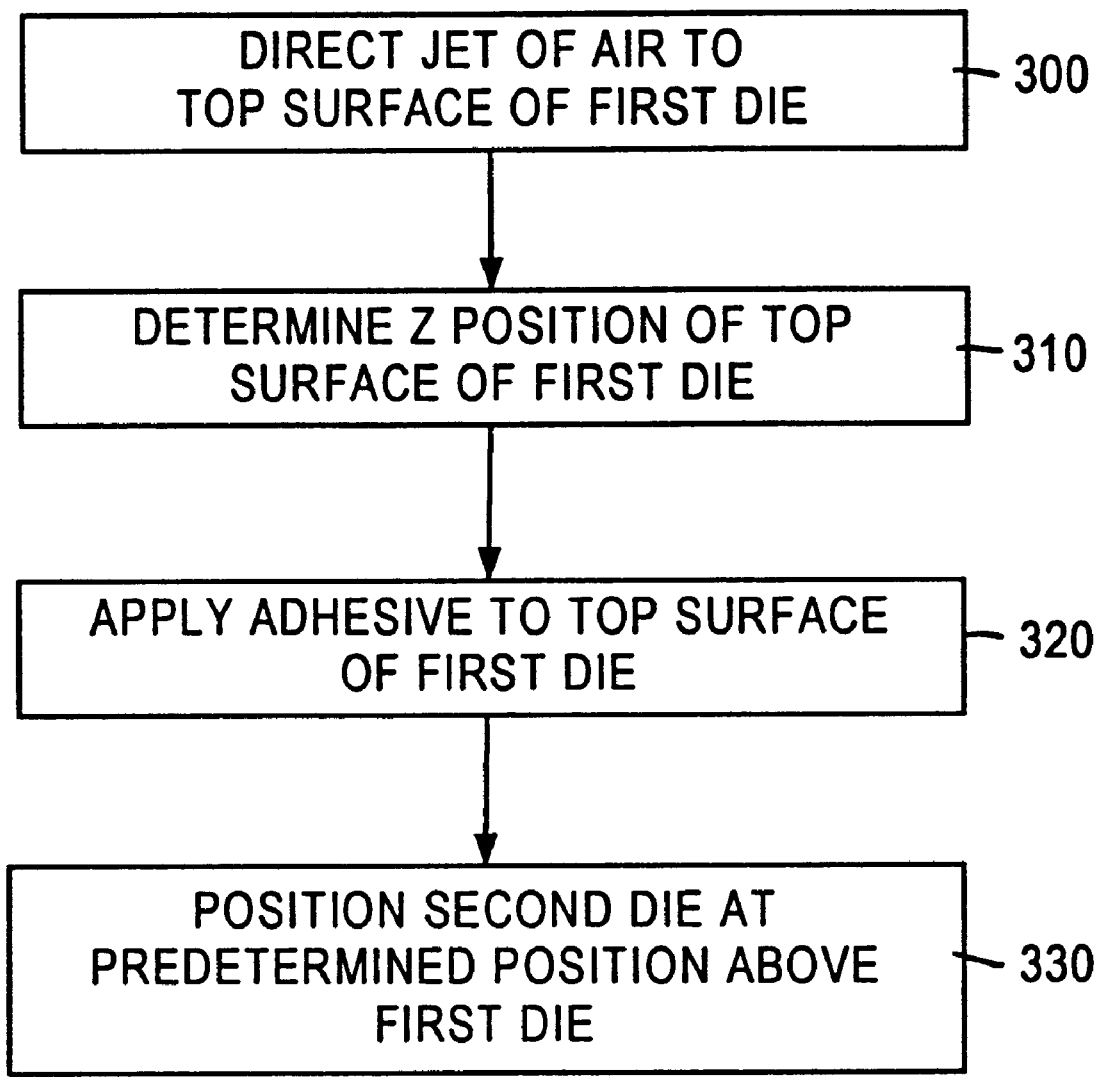
FIG. 3 is a flow chart of sequential steps in a method according to an embodiment of the present invention.

Referring now to FIGS. 2A, 2B and 3, a method and apparatus according to the present invention comprises a conventional die bonder 200, such as the Model pb 2007die bonder available from ESEC of Switzerland, having a controller 230 for adjusting the descending height of a die bonding head 240 based on a signal from a sensor, such as the prior art needle-type sensor described above. An air pressure sensor 210 is provided for directing a jet of air 220 at the top surface 120a of first die 120 previously bonded to substrate 100 (see step 300). Air pressure sensor 210 is preferably a commercially available air pressure sensor such as the Sigma 9600EC, manufactured by Sigmatech, Inc. of Arizona, and conventionally used for measuring wafer thickness. Air pressure sensor 210 generates a signal, such as an electrical signal, indicative of a vertical position z of top surface 120a (see step 310), and sends the signal to die bonder controller 230. Vertical position z; i.e., the height of the substrate 100/adhesive 110/first die 120 assembly, is typically about 15–20 mils, and varies due to the variation in height of each component of the assembly. Air pressure sensor 210 typically requires calibration before use, such as by placing a calibration block of a known height or a sample device in die bonder 200 and adjusting sensor 210 or controller 230 to produce the desired accuracy.

Next, at step 320, adhesive 130 is applied to top surface 120a of first die 120, and at step 330 controller 230 controls die bonder head 240 to position second die 140 a predetermined distance; i.e., a gap G, above top surface 120a based on a signal from air pressure sensor 210. Gap G is set to ensure that adhesive 130 bonds the two dies 120, 140 together while not being squeezed out between them, and to avoid damage due to contact between dies.

The present invention is usable any time the height of a substrate needs to be measured. For example, the above-described apparatus and methodology can be used for bonding first die 120 to substrate 100 (prior to bonding second die 140 to first die 120) by sensing the height of substrate 100 with air sensor 120, then positioning first die 120 above the top surface of substrate 100 with a proper gap after applying adhesive 110 to substrate 100.

Figure 4:
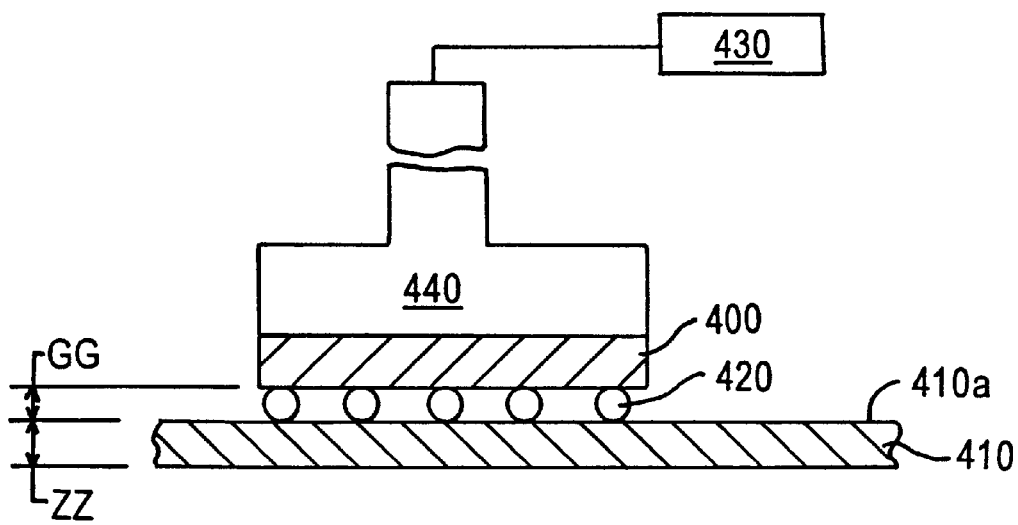
FIG. 4 schematically illustrates a further embodiment of the present invention.

In a further embodiment of the present invention, illustrated in FIG. 4, a flip-chip 400 is assembled to the top surface 410a of a substrate 410 via solder balls 420. The height zz of substrate 410 is first measured using air pressure sensor 210 (see FIG. 2A) as described above, then controller 430 sets the descending height of bonder head 440 based on the measurement of height zz to produce a gap GG between top surface 410a and flip-chip 400 such that solder balls 420 are in contact with bonding pads (not shown) on top surface 410a of substrate 410. Heat is then applied to melt solder balls 420 and bond flip-chip 400 to substrate 410.

The present invention can be practiced by employing conventional materials, methodology and equipment. Accordingly, the details of such materials, equipment and methodology are not set forth herein in detail. In previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in carious other combinations and enviroments and is capable of changes or modifications within the scope of the inventive concept as expressed herein.

What is claimed is:

1. An apparatus comprising:
   a die bonder for attaching a semiconductor device to a substrate;
   an air pressure sensor for generating a signal indicative of a verbal position of a top surface of the substrate; and
   a controller, responsive to the air pressure sensor signal, for controlling the die bonder to position the semiconductor device a predetermined distance above the top surface of the substrate.

2. The apparatus of claim 1, wherein the air pressure sensor generates the signal responsive to back pressure in the sensor caused by the top surface of the substrate.

3. A method of manufacturing a semiconductor package assembly, which method comprises:
   directing a jet of air to a top surface of a substrate;
   determining a vertical position of the top surface of the substrate based on the back pressure of the jet of air; and
   positioning a semiconductor device a predetermined distance above the top surface of the substrate, based on the determination of the vertical position of the substrate top surface, for bonding the semiconductor device to the substrate.

4. The method of claim 3, further comprising placing an adhesive between the semiconductor device and the substrate prior to the positioning step, wherein the predetermined distance is such that the semiconductor device is bonded to the substrate by the adhesive.

5. The method of claim 3, wherein the substrate is a first die and the semiconductor device is a second die, comprising, prior to directing the jet of air to the top surface of the first die:

directing the jet of air to a top surface of a circuit board or lead frame;

determining a vertical position of the top surface of the circuit board or lead frame based on the back pressure of the jet of air; and positioning the first die a first predetermined distance above the top surface of the circuit board or lead frame, based on the determination of the vertical position of the top surface of the circuit board or lead frame, for bonding the first die to the circuit board or lead frame.

6. The method of claim 3, wherein the semiconductor device is a flip-chip having an array of solder balls, wherein the substrate has a corresponding array of bonding pads, and wherein the predetermined distance is such that when the flip-chip is positioned above the top surface of the substrate, the solder balls are in contact with the bonding pads; the method comprising heating to melt the solder balls and bond the flip-chip to the substrate.

7. An apparatus comprising:

a die bonder for attaching a semiconductor device to a substrate;

an air pressure sensor for generating a signal indicative of a vertical position of a top surface of the substrate; and a controller, responsive to the air pressure sensor signal, for controlling the die bonder to position the semiconductor device a predetermined distance above the top surface of the substrate;

wherein the substrate is a first semiconductor die, and the semiconductor device is a second semiconductor die.

8. An apparatus comprising:

a die bonder for attaching a semiconductor device to a substrate;

an air pressure sensor for generating a signal indicative of a vertical position of a top surface of the substrate; and a controller, responsive to the air pressure sensor signal, for controlling the die bonder to position the semiconductor device a predetermined distance above the top surface of the substrate;

wherein the substrate is a lead frame or a circuit board.

* * * * *